(12) United States Patent
Kim (10) Patent No.: US 10,153,028 B2
(45) Date of Patent: Dec. 11, 2018

(54) SEMICONDUCTOR DEVICES

(71) Applicant: SK hynix Inc., Incheon-si, Gyeonggi-do (KR)

(72) Inventor: Chang Hyun Kim, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 64 days.

(21) Appl. No.: 15/609,219

(22) Filed: May 31, 2017

(65) Prior Publication Data

US 2018/0197597 A1 Jul. 12, 2018

(30) Foreign Application Priority Data

Jan. 6, 2017 (KR) .................... 10-2017-0002330

(51) Int. Cl.
| | |
|---|---|
| G11C 29/00 | (2006.01) |
| G11C 11/406 | (2006.01) |
| G06F 11/10 | (2006.01) |
| G11C 29/52 | (2006.01) |
| G11C 11/4094 | (2006.01) |

(52) U.S. Cl.
CPC .... *G11C 11/40615* (2013.01); *G06F 11/1068* (2013.01); *G11C 11/40618* (2013.01); *G11C 29/52* (2013.01); *G11C 11/4094* (2013.01)

(58) Field of Classification Search
CPC ........ G11C 11/40615; G11C 11/40618; G11C 11/1068; G11C 11/4094; G11C 11/406; G11C 11/40607; G11C 11/40611; G11C 29/52; G11C 2029/0411; G11C 2029/0409; G06F 11/1068

USPC .......... 714/764, 763, 774; 711/706
See application file for complete search history.

(56) References Cited

U.S. PATENT DOCUMENTS

| | | | |
|---|---|---|---|
| 6,560,725 B1 * | 5/2003 | Longwell | G06F 11/073 711/105 |
| 6,859,407 B1 * | 2/2005 | Suh | G11C 11/406 365/203 |
| 9,053,813 B2 * | 6/2015 | Kang | G11C 11/40611 |
| 2004/0243886 A1 | 12/2004 | Klein | |
| 2018/0150350 A1 * | 5/2018 | Cha | G06F 11/106 |

FOREIGN PATENT DOCUMENTS

KR   1020120136674 A   12/2012

* cited by examiner

*Primary Examiner* — Christine T. Tu
(74) *Attorney, Agent, or Firm* — William Park & Associates Ltd.

(57) ABSTRACT

A semiconductor device may be provided. The semiconductor device may include an error scrub control circuit and or an active period signal generation circuit. The error scrub control circuit may be configured to generate an error scrub pre-charge signal and an error scrub bank signal for performing an error scrub operation of memory cells included in banks, based on a bank active signal and a row address signal which are generated based on a refresh signal. The active period signal generation circuit may be configured to generate an active period signal from the bank active signal and the error scrub pre-charge signal based on the error scrub bank signal.

21 Claims, 9 Drawing Sheets

SEMICONDUCTOR DEVICES

CROSS-REFERENCE TO RELATED APPLICATIONS

The present application claims priority under 35 U.S.C 119(a) to Korean Application No. 10-2017-0002330, filed on Jan. 6, 2017, which is incorporated herein by reference in its entirety.

BACKGROUND

1. Technical Field

Embodiments of the present disclosure may generally relate to semiconductor devices, and more particularly to executing an error scrub operation.

2. Related Art

Recently, a DDR2 scheme or a DDR3 scheme receiving and outputting four bit data or eight bit data during each clock cycle time has been used to improve an operation speed of semiconductor devices. If data transmission speeds of the semiconductor devices increases, probability of occurring errors may increase, as well, while the data is transmitted in the semiconductor devices. Accordingly, novel design schemes have been proposed to improve the reliability of the data transmission.

Whenever the data is transmitted in semiconductor devices, error codes which are capable of detecting the occurrence of errors may be generated and transmitted with the data to improve the reliability of data transmission. The error codes may include an error detection code (EDC) which is capable of detecting errors and an error correction code (ECC) which is capable of correcting the errors by itself.

SUMMARY

According to an embodiment, a semiconductor device may be provided. The semiconductor device may include an error scrub control circuit and or an active period signal generation circuit. The error scrub control circuit may be configured to generate an error scrub pre-charge signal and an error scrub bank signal for performing an error scrub operation of memory cells included in banks, based on a bank active signal and a row address signal which are generated based on a refresh signal. The active period signal generation circuit may be configured to generate an active period signal from the bank active signal and the error scrub pre-charge signal based on the error scrub bank signal.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Figure 1:
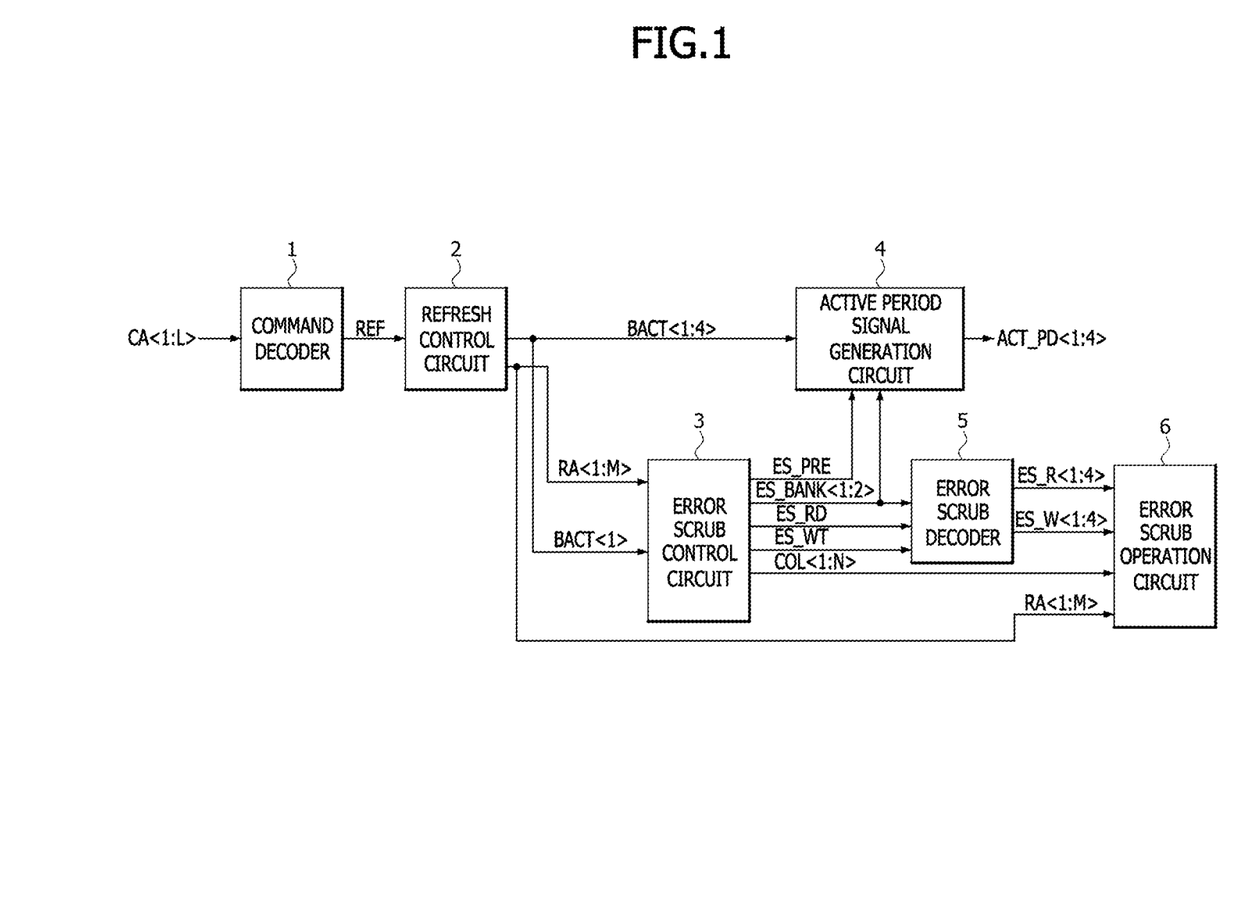
FIG. 1 is a block diagram illustrating a configuration of a semiconductor device according to an embodiment of the present disclosure.

Referring to FIG. 1, a semiconductor device according to an embodiment may include a command decoder 1, a refresh control circuit 2, an error scrub control circuit 3, an active period signal generation circuit 4, an error scrub decoder 5 and an error scrub operation circuit 6.

The command decoder 1 may generate a refresh signal REF in response to an external control signal CA<1:L>. The external control signal CA<1:L> may include at least one of a command and an address. The command decoder 1 may decode a command included in the external control signal CA<1:L> to generate the refresh signal REF. The refresh signal REF may be enabled for a refresh operation including an error scrub operation. The refresh signal REF may include pulses that mean an enablement state of the refresh signal REF. The number "L" of bits included in the external control signal CA<1:L> may be set to be different according to the embodiments.

The refresh control circuit 2 may generate first to fourth bank active signals BACT<1:4> and a row address signal RA<1:M> in response to the refresh signal REF. The refresh control circuit 2 may generate the row address signal RA<1:M> and the first to fourth bank active signals BACT<1:4> if the refresh signal REF is enabled. One of the first to fourth bank active signals BACT<1:4> may be selectively enabled for the error scrub operation if the refresh signal REF is enabled. Each of the first to fourth bank active signals BACT<1:4> may include pulses that mean an enablement state thereof. For example, the refresh control circuit 2 may sequentially activate a plurality of word lines (not illustrated) included in a bank (not illustrated) performing an active operation according to a logic level combination of bits included in the row address signal RA<1:M> while the first bank active signal BACT<1> is enabled for the error scrub operation. Logic level combinations of bits included in the row address signal RA<1:M> for activating the word lines may be set to be different according to the embodiments. Although a present embodiment is described in conjunction with an example in which the semiconductor device includes four banks, the present disclosure is not limited thereto. For example, in some embodiments, the number of the banks included in the semiconductor device may be less or greater than three. The number "M" of bits included in the row address signal RA<1:M> may be set to be different according to the embodiments.

The error scrub control circuit 3 may generate an error scrub pre-charge signal ES_PRE, first and second error scrub bank signals ES_BANK<1:2>, an error scrub read signal ES_RD, an error scrub write signal ES_WT and a column address signal COL<1:N> in response to the first bank active signal BACT<1> and the row address signal RA<1:M>. The error scrub control circuit 3 may generate the error scrub read signal ES_RD, the error scrub write signal ES_WT and the error scrub pre-charge signal ES_PRE in response to the first bank active signal BACT<1>. The error scrub control circuit 3 may delay the first bank active signal BACT<1> to generate the error scrub read signal ES_RD, the error scrub write signal ES_WT and the error scrub pre-charge signal ES_PRE which are sequentially enabled. Each of the error scrub read signal ES_RD, the error scrub write signal ES_WT and the error scrub pre-charge signal ES_PRE may include pulses that mean an enablement state thereof. In some embodiments, the error scrub control circuit 3 may be realized to generate the error scrub read signal ES_RD, the error scrub write signal ES_WT and the error scrub pre-charge signal ES_PRE in response to at least one of the second to fourth bank active signals BACT<2:4>. The error scrub control circuit 3 may generate the first and second error scrub bank signals ES_BANK<1:2> and the column address signal COL<1:N> in response to the row address signal RA<1:M>. The error scrub control circuit 3 may sense the row address signal RA<1:M> to output the first and second error scrub bank signals ES_BANK<1:2> that are counted if all of word lines included in a bank (not illustrated) performing the active operation are sequentially activated. For example, while the first and second error scrub bank signals ES_BANK<1:2> have a logic level combination of 'L,L' (i.e., low, low), the first and second error scrub bank signals ES_BANK<1:2> may be counted to have a logic level combination of 'L,H' (i.e., low, high) if the bits included in the row address signal RA<1:M> have a predetermined logic level combination after all of row addresses of the bank performing the error scrub operation are sequentially enabled. The error scrub control circuit 3 may sense the first and second error scrub bank signals ES_BANK<1:2> to count the column address signal COL<1:N>. For example, if the first and second error scrub bank signals ES_BANK<1:2> have a logic level combination of 'H,H' after the first and second error scrub bank signals ES_BANK<1:2> are sequentially counted in order of 'L,L', 'L,H', 'H,L' and 'H,H', the error scrub control circuit 3 may count the column address signal COL<1:N>. As the column address signal COL<1:N> is counted, all of bit lines (not illustrated) included in the bank performing the active operation may be sequentially selected. If one of the bit lines is selected, a datum may be outputted from a memory cell in the bank through the selected bit line or a datum may be inputted to a memory cell in the bank through the selected bit line. In the first and second error scrub bank signals ES_BANK<1:2>, a logic level combination of 'L,H' means that the first error scrub bank signal ES_BANK<1> has a logic "high" level and the second error scrub bank signal ES_BANK<2> has a logic "low" level.

The active period signal generation circuit 4 may generate first to fourth active period signals ACT_PD<1:4> from the first to fourth bank active signals BACT<1:4> and the error scrub pre-charge signal ES_PRE in response to the first and second error scrub bank signals ES_BANK<1:2>. The active period signal generation circuit 4 may set an enablement period of any one among the first to fourth active period signals ACT_PD<1:4> from the first bank active signal BACT<1> and the error scrub pre-charge signal ES_PRE according to a logic level combination of the first and second error scrub bank signals ES_BANK<1:2>. The active period signal generation circuit 4 may generate the first active period signal ACT_PD<1> which is enabled in synchronization with the first bank active signal BACT<1> and which is disabled in synchronization with the error scrub pre-charge signal ES_PRE, if the first and second error scrub bank signals ES_BANK<1:2> have a logic level combination of 'L,L'. The active period signal generation circuit 4 may generate the second active period signal ACT_PD<2> which is enabled in synchronization with the first bank active signal BACT<1> and which is disabled in synchronization with the error scrub pre-charge signal ES_PRE, if the first and second error scrub bank signals ES_BANK<1:2> have a logic level combination of 'L,H'. The active period signal generation circuit 4 may generate the third active period signal ACT_PD<3> which is enabled in synchronization with the first bank active signal BACT<1> and which is disabled in synchronization with the error scrub pre-charge signal ES_PRE, if the first and second error scrub bank signals ES_BANK<1:2> have a logic level combination of 'H,L'. The active period signal generation circuit 4 may generate the fourth active period signal ACT_PD<4> which is enabled in synchronization with the first bank active signal BACT<1> and which is disabled in synchronization with the error scrub pre-charge signal ES_PRE, if the first and second error scrub bank signals ES_BANK<1:2> have a logic level combination of 'H,H'. The active period signal generation circuit 4 may generate the first to fourth active period signals ACT_PD<1:4> from the first to fourth bank active signals BACT<1:4> if the error scrub operation is not performed and the refresh operation is performed. If the error scrub operation is not performed, the first and second error scrub bank signals ES_BANK<1:2> may be set not to have any logic level combination, for example, may be set to have a Hi-z state. If the error scrub operation is not performed, the active period signal generation circuit 4 may generate the first active period signal ACT_PD<1> whose enablement period is set by the first bank active signal BACT<1>, may generate the second active period signal ACT_PD<2> whose enablement period is set by the second bank active signal BACT<2>, may generate the third active period signal ACT_PD<3> whose enablement period is set by the third bank active signal BACT<3>, and may generate the fourth active period signal ACT_PD<4> whose enablement period is set by the fourth bank active signal BACT<4>.

The error scrub decoder 5 may generate first to fourth decoded read signals ES_R<1:4> and first to fourth decoded write signals ES_W<1:4> in response to the first and second error scrub bank signals ES_BANK<1:2>, the error scrub read signal ES_RD and the error scrub write signal ES_WT. The error scrub decoder 5 may generate the first to fourth decoded read signals ES_R<1:4>, one of which is selectively enabled to perform a read operation of any one selected from first to fourth banks (not illustrated) and may generate the first to fourth decoded write signals ES_W<1: 4>, one of which is selectively enabled to perform a write operation of the selected bank, according to a logic level combination of the first and second error scrub bank signals ES_BANK<1:2>. The error scrub decoder 5 may sequentially generate the first decoded read signal ES_R<1> enabled to perform the read operation of the first bank (not illustrated) and the first decoded write signal ES_W<1> enabled to perform the write operation of the first bank (not illustrated), if the first and second error scrub bank signals ES_BANK<1:2> have a logic level combination of 'L,L'. The error scrub decoder 5 may sequentially generate the second decoded read signal ES_R<2> enabled to perform the read operation of the second bank (not illustrated) and the second decoded write signal ES_W<2> enabled to perform the write operation of the second bank (not illustrated), if the first and second error scrub bank signals ES_BANK<1:2> have a logic level combination of 'L,H'. The error scrub decoder 5 may sequentially generate the third decoded read signal ES_R<3> enabled to perform the read operation of the third bank (not illustrated) and the third decoded write signal ES_W<3> enabled to perform the write operation of the third bank (not illustrated), if the first and second error scrub bank signals ES_BANK<1:2> have a logic level combination of 'H,L'. The error scrub decoder 5 may sequentially generate the fourth decoded read signal ES_R<4> enabled to perform the read operation of the fourth bank (not illustrated) and the fourth decoded write signal ES_W<4> enabled to perform the write operation of the fourth bank (not illustrated), if the first and second error scrub bank signals ES_BANK<1:2> have a logic level combination of 'H,H'.

The error scrub operation circuit 6 may perform an error scrub operation of the first to fourth banks (not illustrated) in response to the first to fourth decoded read signals ES_R<1:4>, the first to fourth decoded write signals ES_W<1:4>, the row address signal RA<1:M> and the column address signal COL<1:N>. The error scrub operation circuit 6 may sequentially perform the read operation and the write operation using a bit line which is selected by the column address signal COL<1:N> among bit lines (not illustrated) included in the first bank (not illustrated), if the first decoded read signal ES_R<1> and the first decoded write signal ES_W<1> are sequentially enabled. The error scrub operation circuit 6 may sequentially perform the read operation and the write operation using a bit line which is selected by the column address signal COL<1:N> among the bit lines (not illustrated) included in the second bank (not illustrated), if the second decoded read signal ES_R<2> and the second decoded write signal ES_W<2> are sequentially enabled. The error scrub operation circuit 6 may sequentially perform the read operation and the write operation using a bit line which is selected by the column address signal COL<1:N> among the bit lines (not illustrated) included in the third bank (not illustrated), if the third decoded read signal ES_R<3> and the third decoded write signal ES_W<3> are sequentially enabled. The error scrub operation circuit 6 may sequentially perform the read operation and the write operation using a bit line which is selected by the column address signal COL<1:N> among the bit lines (not illustrated) included in the fourth bank (not illustrated), if the fourth decoded read signal ES_R<4> and the fourth decoded write signal ES_W<4> are sequentially enabled.

Figure 2:
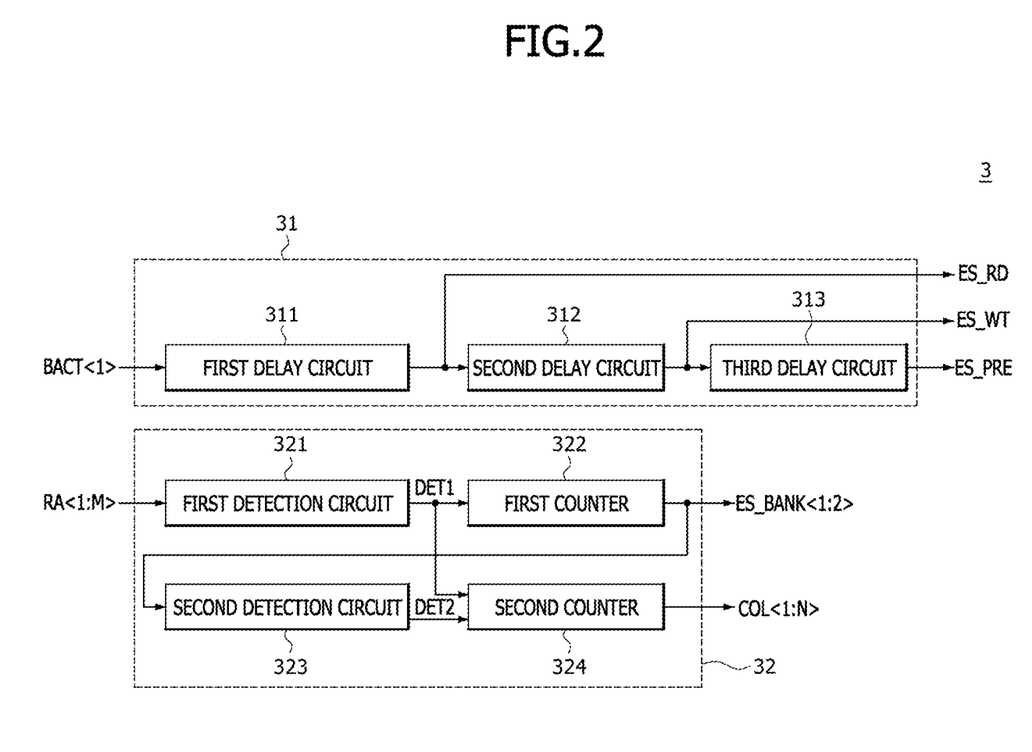
FIG. 2 is a block diagram illustrating an example of an error scrub control circuit included in the semiconductor device of FIG. 1.

Referring to FIG. 2, the error scrub control circuit 3 may include an error scrub command generation circuit 31 and an error scrub address generation circuit 32.

The error scrub command generation circuit 31 may include a first delay circuit 311, a second delay circuit 312 and a third delay circuit 313. The first delay circuit 311 may delay the first bank active signal BACT<1> by a first delay period to generate the error scrub read signal ES_RD. The second delay circuit 312 may delay the error scrub read signal ES_RD by a second delay period to generate the error scrub write signal ES_WT. The third delay circuit 313 may delay the error scrub write signal ES_WT by a third delay period to generate the error scrub pre-charge signal ES_PRE. The error scrub read signal ES_RD may be enabled at a point of time that the first delay period elapses from a point of time that the first bank active signal BACT<1> is enabled. The error scrub write signal ES_WT may be enabled at a point of time that the second delay period elapses from a point of time that the error scrub read signal ES_RD is enabled. The error scrub pre-charge signal ES_PRE may be enabled at a point of time that the third delay period elapses from a point of time that the error scrub write signal ES_WT is enabled. The first to third delay periods may be set to be different according to the embodiments.

The error scrub address generation circuit 32 may include a first detection circuit 321, a first counter 322, a second detection circuit 323 and a second counter 324. The first detection circuit 321 may generate a first detection signal DET1 in response to the row address signal RA<1:M>. The first detection circuit 321 may generate the first detection signal DET1 which is enabled if a logic level combination of the row address signal RA<1:M> corresponds to a last word line in included in each bank (not illustrated). If a first logic level combination of the row address signal RA<1:M> corresponds to a first word line included in each bank and a $K^{th}$ logic level combination of the row address signal RA<1:M> corresponds to a last word line in included in each bank, the first detection circuit 321 may generate the first detection signal DET1 which is enabled when the row address signal RA<1:M> having the $K^{th}$ logic level combination is inputted to the first detection circuit 321. The first detection signal DET1 may include pulses that mean an enablement state of the first detection signal DET1. The first counter 322 may generate the first and second error scrub bank signals ES_BANK<1:2> in response to the first detection signal DET1. The first counter 322 may generate the first and second error scrub bank signals ES_BANK<1:2> that are sequentially counted in synchronization with a point of time that the first detection signal DET1 is enabled. The first and second error scrub bank signals ES_BANK<1:2> may be sequentially counted in order of 'L,L', 'L,H', 'H,L' and 'H,H'. The second detection circuit 322 may generate a second detection signal DET2 in response to the first and second error scrub bank signals ES_BANK<1:2>. The second detection circuit 323 may generate the second detection signal DET2 which is enabled if a logic level combination of the first and second error scrub bank signals ES_BANK<1:2> corresponds to a last bank (not illustrated). The second detection circuit 323 may generate the second detection signal DET2 which is enabled if the first and second error scrub bank signals ES_BANK<1:2> have a logic level combination of 'H,H'. The second detection signal DET2 may include pulses that mean an enablement state of the second detection signal DET2. The second counter 324 may generate the column address signal COL<1:N> in response to the first and second detection signals DET1 and DET2. The second counter 322 may generate the column address signal COL<1:N> that is sequentially counted in synchronization with points of time that the first and second detection signals DET1 and DET2 are enabled. The column address signal COL<1:N> may be counted up bit by bit to sequentially select bit lines (not illustrated) included in each bank (not illustrated).

Figure 3:
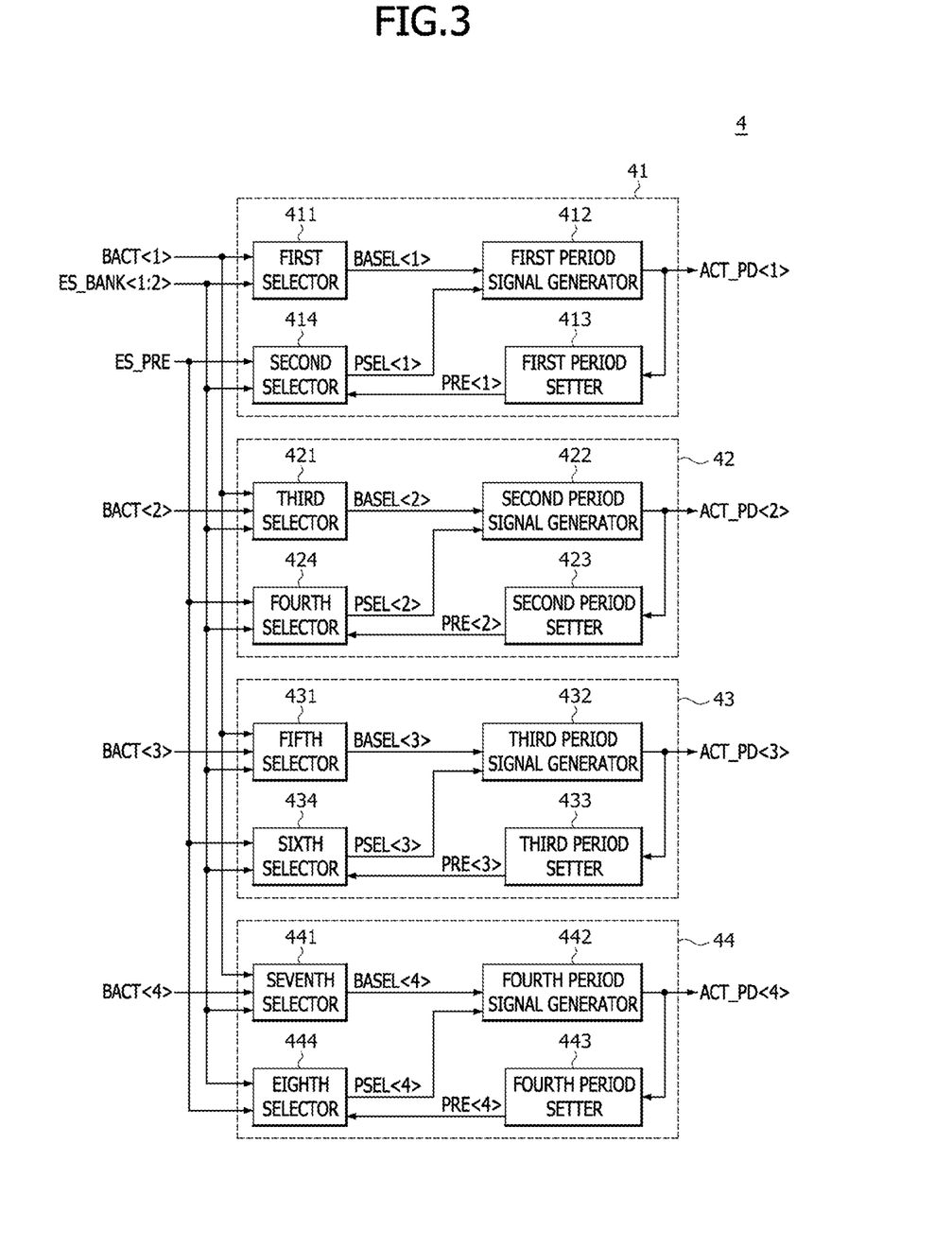
FIG. 3 is a block diagram illustrating an example of an active period signal generation circuit included in the semiconductor device of FIG. 1.

Referring to FIG. 3, the active period signal generation circuit 4 may include a first active period signal generation circuit 41, a second active period signal generation circuit 42, a third active period signal generation circuit 43 and a fourth active period signal generation circuit 44.

The first active period signal generation circuit 41 may include a first selector 411, a first period signal generator 412, a first period setter 413 and a second selector 414. The first selector 411 may generate a first bank active selection signal BASEL<1> from the first bank active signal BACT<1> in response to the first and second error scrub bank signals ES_BANK<1:2>. The first selector 411 may select and output the first bank active signal BACT<1> as the first bank active selection signal BASEL<1> if the first and second error scrub bank signals ES_BANK<1:2> have a logic level combination of 'L,L'. The first selector 411 may select and output the first bank active signal BACT<1> as the first bank active selection signal BASEL<1> while the first and second error scrub bank signals ES_BANK<1:2> do not have any logic level combinations. The first period signal generator 412 may generate the first active period signal ACT_PD<1> in response to the first bank active selection signal BASEL<1> and a first pre-charge selection signal PSEL<1>. The first active period signal ACT_PD<1> may be enabled in synchronization with a point of time that the first bank active selection signal BASEL<1> is enabled and may be disabled in synchronization with a point of time that the first pre-charge selection signal PSEL<1> is enabled. The first period setter 413 may delay the first active period signal ACT_PD<1> by a first active period to generate a first pre-charge signal PRE<1>. The first active period may be set to be different according to the embodiments. The second selector 414 may output the first pre-charge signal PRE<1> or the error scrub pre-charge signal ES_PRE as the first pre-charge selection signal PSEL<1> in response to the first and second error scrub bank signals ES_BANK<1:2>. The second selector 414 may output the error scrub pre-charge signal ES_PRE as the first pre-charge selection signal PSEL<1> if the first and second error scrub bank signals ES_BANK<1:2> have a logic level combination of 'L,L'. The second selector 414 may output the first pre-charge signal PRE<1> as the first pre-charge selection signal PSEL<1> while the first and second error scrub bank signals ES_BANK<1:2> do not have any logic level combinations.

The second active period signal generation circuit 42 may include a third selector 421, a second period signal generator 422, a second period setter 423 and a fourth selector 424. The third selector 421 may generate a second bank active selection signal BASEL<2> from the first bank active signal BACT<1> or the second bank active signal BACT<2> in response to the first and second error scrub bank signals ES_BANK<1:2>. The third selector 421 may select and output the first bank active signal BACT<1> as the second bank active selection signal BASEL<2> if the first and second error scrub bank signals ES_BANK<1:2> have a logic level combination of 'L,H'. The third selector 421 may select and output the second bank active signal BACT<2> as the second bank active selection signal BASEL<2> while the first and second error scrub bank signals ES_BANK<1:2> do not have any logic level combinations. The second period signal generator 422 may generate the second active period signal ACT_PD<2> in response to the second bank active selection signal BASEL<2> and a second pre-charge selection signal PSEL<2>. The second active period signal ACT_PD<2> may be enabled in synchronization with a point of time that the second bank active selection signal BASEL<2> is enabled and may be disabled in synchronization with a point of time that the second pre-charge selection signal PSEL<2> is enabled. The second period setter 423 may delay the second active period signal ACT_PD<2> by a second active period to generate a second pre-charge signal PRE<2>. The second active period may be set to be different according to the embodiments. The fourth selector 424 may output the second pre-charge signal PRE<2> or the error scrub pre-charge signal ES_PRE as the second pre-charge selection signal PSEL<2> in response to the first and second error scrub bank signals ES_BANK<1:2>. The fourth selector 424 may output the error scrub pre-charge signal ES_PRE as the second pre-charge selection signal PSEL<2> if the first and second error scrub bank signals ES_BANK<1:2> have a logic level combination of 'L,H'. The fourth selector 424 may output the second pre-charge signal PRE<2> as the second pre-charge selection signal PSEL<2> while the first and second error scrub bank signals ES_BANK<1:2> do not have any logic level combinations.

The third active period signal generation circuit 43 may include a fifth selector 431, a third period signal generator 432, a third period setter 433 and a sixth selector 434. The fifth selector 431 may generate a third bank active selection signal BASEL<3> from the first bank active signal BACT<1> or the third bank active signal BACT<3> in response to the first and second error scrub bank signals ES_BANK<1:2>. The fifth selector 431 may select and output the first bank active signal BACT<1> as the third bank active selection signal BASEL<3> if the first and second error scrub bank signals ES_BANK<1:2> have a logic level combination of 'H,L'. The fifth selector 431 may select and output the third bank active signal BACT<3> as the third bank active selection signal BASEL<3> while the first and second error scrub bank signals ES_BANK<1:2> do not have any logic level combinations. The third period signal generator 432 may generate the third active period signal ACT_PD<3> in response to the third bank active selection signal BASEL<3> and a third pre-charge selection signal PSEL<3>. The third active period signal ACT_PD<3> may be enabled in synchronization with a point of time that the third bank active selection signal BASEL<3> is enabled and may be disabled in synchronization with a point of time that the third pre-charge selection signal PSEL<3> is enabled. The third period setter 433 may delay the third active period signal ACT_PD<3> by a third active period to generate a third pre-charge signal PRE<3>. The third active period may be set to be different according to the embodiments. The sixth selector 434 may output the third pre-charge signal PRE<3> or the error scrub pre-charge signal ES_PRE as the third pre-charge selection signal PSEL<3> in response to the first and second error scrub bank signals ES_BANK<1:2>. The sixth selector 434 may output the error scrub pre-charge signal ES_PRE as the third pre-charge selection signal PSEL<3> if the first and second error scrub bank signals ES_BANK<1:2> have a logic level combination of 'H,L'. The sixth selector 434 may output the third pre-charge signal PRE<3> as the third pre-charge selection signal PSEL<3> while the first and second error scrub bank signals ES_BANK<1:2> do not have any logic level combinations.

The fourth active period signal generation circuit 44 may include a seventh selector 441, a fourth period signal generator 442, a fourth period setter 443 and an eighth selector 444. The seventh selector 441 may generate a fourth bank active selection signal BASEL<4> from the first bank active signal BACT<1> or the fourth bank active signal BACT<4> in response to the first and second error scrub bank signals ES_BANK<1:2>. The seventh selector 431 may select and output the first bank active signal BACT<1> as the fourth bank active selection signal BASEL<4> if the first and second error scrub bank signals ES_BANK<1:2> have a logic level combination of 'H,H'. The seventh selector 441 may select and output the fourth bank active signal BACT<4> as the fourth bank active selection signal BASEL<4> while the first and second error scrub bank signals ES_BANK<1:2> do not have any logic level combinations. The fourth period signal generator 442 may generate the fourth active period signal ACT_PD<4> in response to the fourth bank active selection signal BASEL<4> and a fourth pre-charge selection signal PSEL<4>. The fourth active period signal ACT_PD<4> may be enabled in synchronization with a point of time that the fourth bank active selection signal BASEL<4> is enabled and may be disabled in synchronization with a point of time that the fourth pre-charge selection signal PSEL<4> is enabled. The fourth period setter 443 may delay the fourth active period signal ACT_PD<4> by a fourth active period to generate a fourth pre-charge signal PRE<4>. The fourth active period may be set to be different according to the embodiments. The eighth selector 444 may output the fourth pre-charge signal PRE<4> or the error scrub pre-charge signal ES_PRE as the fourth pre-charge selection signal PSEL<4> in response to the first and second error scrub bank signals ES_BANK<1:2>. The eighth selector 444 may output the error scrub pre-charge signal ES_PRE as the fourth pre-charge selection signal PSEL<4> if the first and second error scrub bank signals ES_BANK<1:2> have a logic level combination of 'H,H'. The eighth selector 444 may output the fourth pre-charge signal PRE<4> as the fourth pre-charge selection signal PSEL<4> while the first and second error scrub bank signals ES_BANK<1:2> do not have any logic level combinations.

Figure 4:
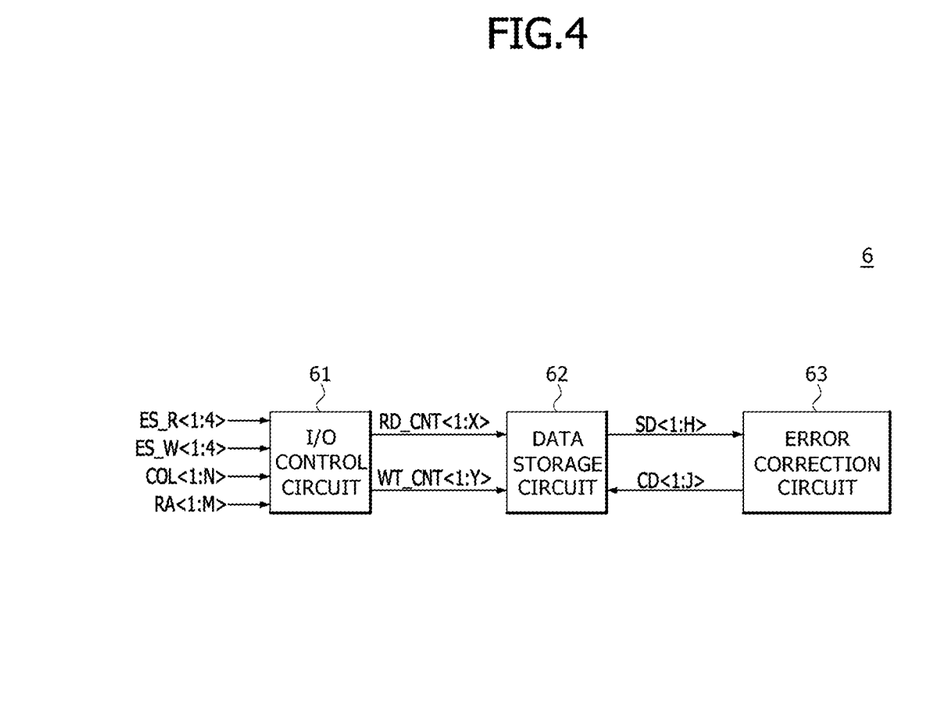
FIG. 4 is a block diagram illustrating an example of an error scrub operation circuit included in the semiconductor device of FIG. 1.

Referring to FIG. 4, the error scrub operation circuit 6 may include an input and output (input/output) (I/O) control circuit 61, a data storage circuit 62 and an error correction circuit 63.

The I/O control circuit 61 may generate a read control signal RD_CNT<1:X> and a write control signal WT_CNT<1:Y> in response to the first to fourth decoded read signals ES_R<1:4>, the first to fourth decoded write signals ES_W<1:4>, the column address signal COL<1:N> and the row address signal RA<1:M>. The I/O control circuit 61 may generate the read control signal RD_CNT<1:X> whose logic level combination is determined by the column address signal COL<1:N> and the row address signal RA<1:M> if one of the first to fourth decoded read signals ES_R<1:4> is enabled during the read operation. For example, the I/O control circuit 61 may generate the read control signal RD_CNT<1:X> for outputting data stored in memory cells included in a second bank (not illustrated) if the second decoded read signal ES_R<2> is enabled. A logic level combination of bits included in the read control signal RD_CNT<1:X> may be determined by logic level combinations of the column address signal COL<1:N> and the row address signal RA<1:M>. The read control signal RD_CNT<1:X> may include signals for controlling an operation that is performed to read out data from memory cells (not illustrated) selected according to logic level combinations of the column address signal COL<1:N> and the row address signal RA<1:M> in a selected bank (not illustrated). Although the read control signal RD_CNT<1:X> is illustrated as a single line, the read control signal RD_CNT<1:X> may include a plurality of signals for controlling a plurality of operations for reading out data from the memory cells according to the embodiments. The I/O control circuit 61 may generate the write control signal WT_CNT<1:Y> whose logic level combination is determined by the column address signal COL<1:N> and the row address signal RA<1:M> if one of the first to fourth decoded write signals ES_W<1:4> is enabled during the write operation. For example, the I/O control circuit 61 may generate the write control signal WT_CNT<1:Y> for storing data into memory cells included in a third bank (not illustrated) if the third decoded write signal ES_W<3> is enabled. A logic level combination of bits included in the write control signal WT_CNT<1:Y> may be determined by logic level combinations of the column address signal COL<1:N> and the row address signal RA<1:M>. The write control signal WT_CNT<1:Y> may include signals for controlling an operation that is performed to store data into memory cells (not illustrated) selected according to logic level combinations of the column address signal COL<1:N> and the row address signal RA<1:M> in a selected bank (not illustrated). Although the write control signal WT_CNT<1:Y> is illustrated as a single line, the write control signal WT_CNT<1:Y> may include a plurality of signals for controlling a plurality of operations for storing data into the memory cells according to the embodiments.

The data storage circuit 62 may output stored data SD<1:H> in response to the read control signal RD_CNT<1:X>. The data storage circuit 62 may include a plurality of banks (not illustrated). Each of memory cells included in the plurality of banks may be selected according to a logic level combination of the read control signal RD_CNT<1:X>, and data stored in the selected memory cells may be outputted as the stored data SD<1:H>. The data storage circuit 62 may receive and store corrected data CD<1:J> therein in response to the write control signal WT_CNT<1:Y>. Each of the memory cells included in the plurality of banks may be selected according to a logic level combination of the write control signal WT_CNT<1:Y>, and the corrected data CD<1:J> may be stored into the selected memory cells. The I/O operations for outputting the stored data SD<1:H> and for storing the corrected data CD<1:J> may be the same as a general read operation and a general write operation. Thus, a detailed description of the I/O operations will be omitted.

The error correction circuit 63 may correct errors included in the stored data SD<1:H> to generate the corrected data CD<1:J>. The error correction circuit 63 may generate the corrected data CD<1:J> using an error correction code (ECC). The error correction circuit 63 may generate the corrected data CD<1:J> using parities and syndromes which are generated from the stored data SD<1:H> outputted from the data storage circuit 62 during the read operation. The parities and the syndromes may be generated from the stored data SD<1:H> using an ECC.

Figure 5:
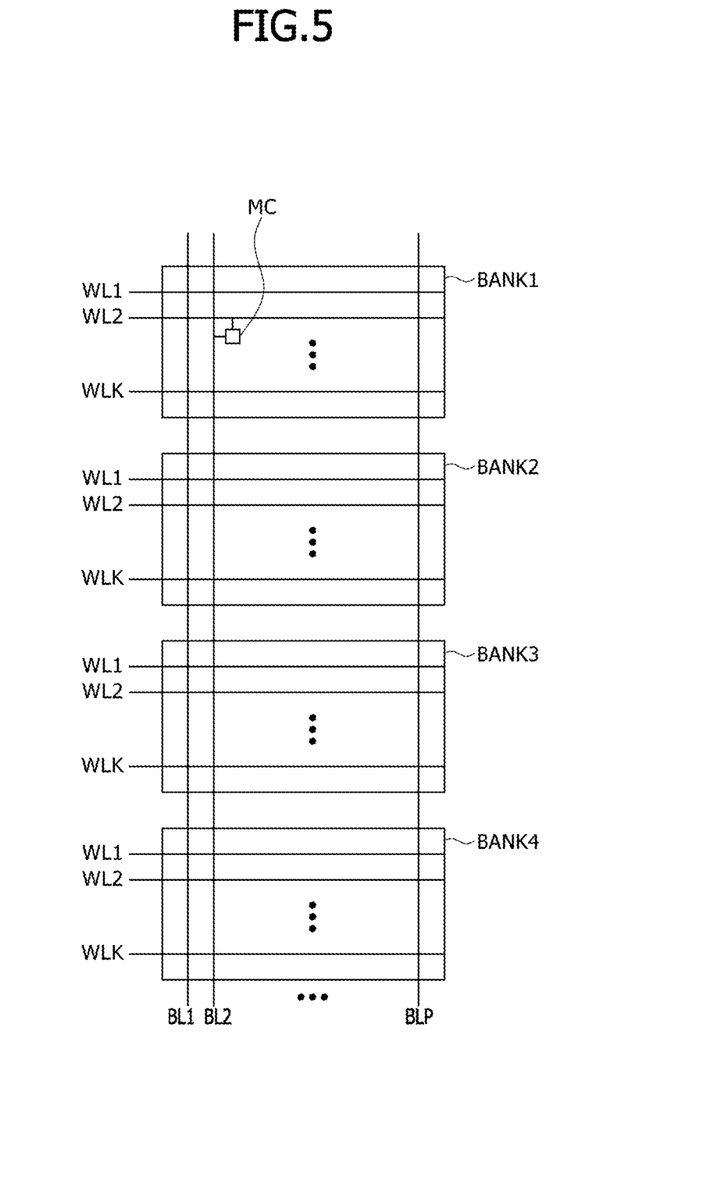
FIG. 5 is a schematic layout diagram illustrating an example of banks included in a semiconductor device according to an embodiment of the present disclosure.

Referring to FIG. 5, a configuration of first to fourth banks BANK1, BANK2, BANK3 and BANK4 including memory cells which are selected according to the read control signal RD_CNT<1:X> or the write control signal WT_CNT<1:Y> is illustrated. In an embodiment, for example, memory cells may be coupled to and located generally at respective intersections of word lines WL1~WLK and bit lines BL1~BLP. However, for simplicity of illustration a single memory cell MC has been illustrated at the intersection of the second word line WL2 and the second bit line BL2 in, for example, the first bank BANK1. The first bank BANK1 may include a plurality memory cells which are connected to first to $K^{th}$ word lines WL1~WLK and first to $P^{th}$ bit lines BL1~BLP. Each of the first to $K^{th}$ word lines WL1~WLK disposed in the first bank BANK1 may be selectively activated according to a logic level combination of the read control signal RD_CNT<1:X> or the write control signal WT_CNT<1:Y>. Each of the first to $P^{th}$ bit lines BL1~BLP disposed in the first bank BANK1 may be selected according to a logic level combination of the read control signal RD_CNT<1:X> or the write control signal WT_CNT<1:Y>. The second bank BANK2 may include a plurality memory cells which are connected to first to $K^{th}$ word lines WL1~WLK and the first to $P^{th}$ bit lines BL1~BLP. Each of the first to K$^{th}$ word lines WL1~WLK disposed in the second bank BANK2 may be selectively activated according to a logic level combination of the read control signal RD_CNT<1:X> or the write control signal WT_CNT<1:Y>. Each of the first to P$^{th}$ bit lines BL1~BLP disposed in the second bank BANK2 may be selected according to a logic level combination of the read control signal RD_CNT<1:X> or the write control signal WT_CNT<1:Y>. The third bank BANK3 may include a plurality memory cells which are connected to first to K$^{th}$ word lines WL1~WLK and the first to P$^{th}$ bit lines BL1~BLP. Each of the first to K$^{th}$ word lines WL1~WLK disposed in the third bank BANK3 may be selectively activated according to a logic level combination of the read control signal RD_CNT<1:X> or the write control signal WT_CNT<1:Y>. Each of the first to P$^{th}$ bit lines BL1~BLP disposed in the third bank BANK3 may be selected according to a logic level combination of the read control signal RD_CNT<1:X> or the write control signal WT_CNT<1:Y>. The fourth bank BANK4 may include a plurality memory cells which are connected to first to K$^{th}$ word lines WL1~WLK and the first to P$^{th}$ bit lines BL1~BLP. Each of the first to K$^{th}$ word lines WL1~WLK disposed in the fourth bank BANK4 may be selectively activated according to a logic level combination of the read control signal RD_CNT<1:X> or the write control signal WT_CNT<1:Y>. Each of the first to P$^{th}$ bit lines BL1~BLP disposed in the fourth bank BANK4 may be selected according to a logic level combination of the read control signal RD_CNT<1:X> or the write control signal WT_CNT<1:Y>. Although the semiconductor according to the present embodiment is illustrated to include four banks, the number of the banks may be less or greater than four according to the embodiments. In an embodiment 'P' and 'K' may be integers greater than zero.

An operation of the semiconductor device having an aforementioned configuration will be described hereinafter with reference to FIGS. 6 and 7.

Figure 6:
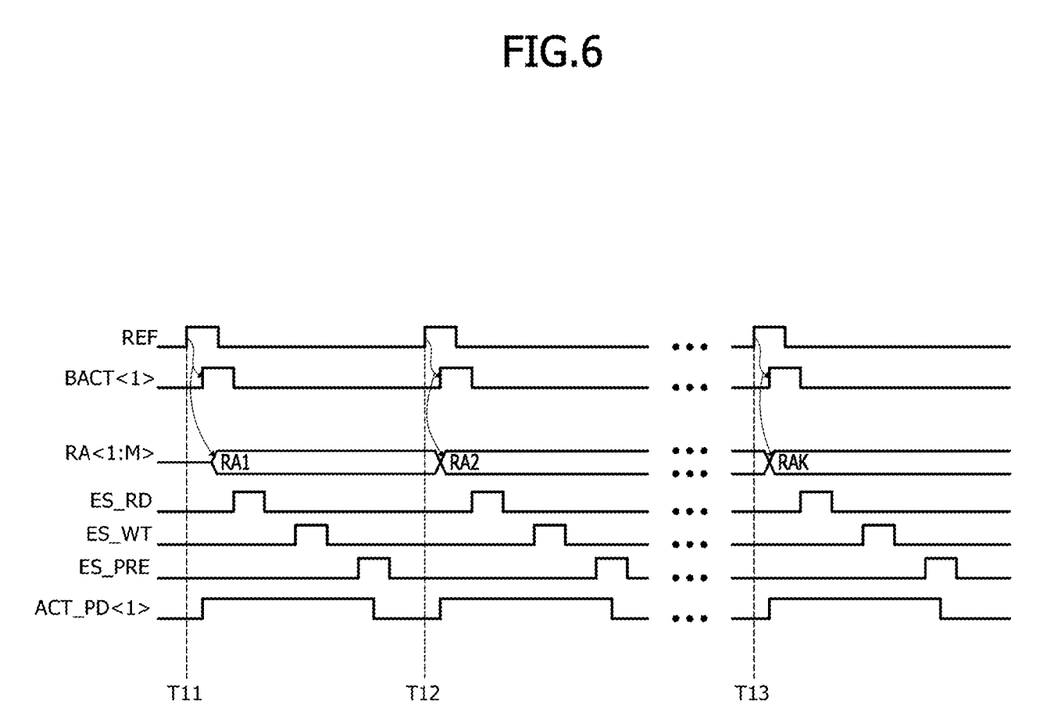
FIGS. 6 and 7 are timing diagrams illustrating error scrub operations of a semiconductor device according to an embodiment of the present disclosure.

Referring to FIG. 6, the row address signal RA<1:M> may be sequentially counted to perform an error scrub operation of the first bank (BANK1 of FIG. 5), and the error scrub read signal ES_RD, the error scrub write signal ES_WT and the error scrub pre-charge signal ES_PRE may be sequentially enabled according to a logic level combination of the row address signal RA<1:M>. In addition, an active period of the first active period signal ACT_PD<1> may be set by the first bank active signal BACT<1> and the error scrub pre-charge signal ES_PRE.

At a point of time "T11", if a first pulse of the refresh signal REF is created, the row address signal RA<1:M> may be set to have a first logic level combination RA1 to activate a first word line of the first bank (BANK1 of FIG. 5) while the first bank active signal BACT<1> is enabled. While the first active period signal ACT_PD<1> is enabled in synchronization with the first bank active signal BACT<1>, the first bank active signal BACT<1> may be delayed to generate the error scrub read signal ES_RD, the error scrub write signal ES_WT and the error scrub pre-charge signal ES_PRE which are sequentially enabled. The first active period signal ACT_PD<1> may be enabled in synchronization with the first bank active signal BACT<1> and may be disabled in synchronization with a pulse of the error scrub pre-charge signal ES_PRE.

At a point of time "T12", if a second pulse of the refresh signal REF is created, the row address signal RA<1:M> may be set to have a second logic level combination RA2 to activate a second word line of the first bank (BANK1 of FIG. 5) while the first bank active signal BACT<1> is enabled. While the first active period signal ACT_PD<1> is enabled in synchronization with the first bank active signal BACT<1>, the first bank active signal BACT<1> may be delayed to generate the error scrub read signal ES_RD, the error scrub write signal ES_WT and the error scrub pre-charge signal ES_PRE which are sequentially enabled. The first active period signal ACT_PD<1> may be enabled in synchronization with the first bank active signal BACT<1> and may be disabled in synchronization with a pulse of the error scrub pre-charge signal ES_PRE.

At a point of time "T13", if a K$^{th}$ pulse of the refresh signal REF is created, the row address signal RA<1:M> may be set to have a K$^{th}$ logic level combination RAK to activate a K$^{th}$ word line of the first bank (BANK1 of FIG. 5) while the first bank active signal BACT<1> is enabled. While the first active period signal ACT_PD<1> is enabled in synchronization with the first bank active signal BACT<1>, the first bank active signal BACT<1> may be delayed to generate the error scrub read signal ES_RD, the error scrub write signal ES_WT and the error scrub pre-charge signal ES_PRE which are sequentially enabled. The first active period signal ACT_PD<1> may be enabled in synchronization with the first bank active signal BACT<1> and may be disabled in synchronization with a pulse of the error scrub pre-charge signal ES_PRE.

Figure 7:
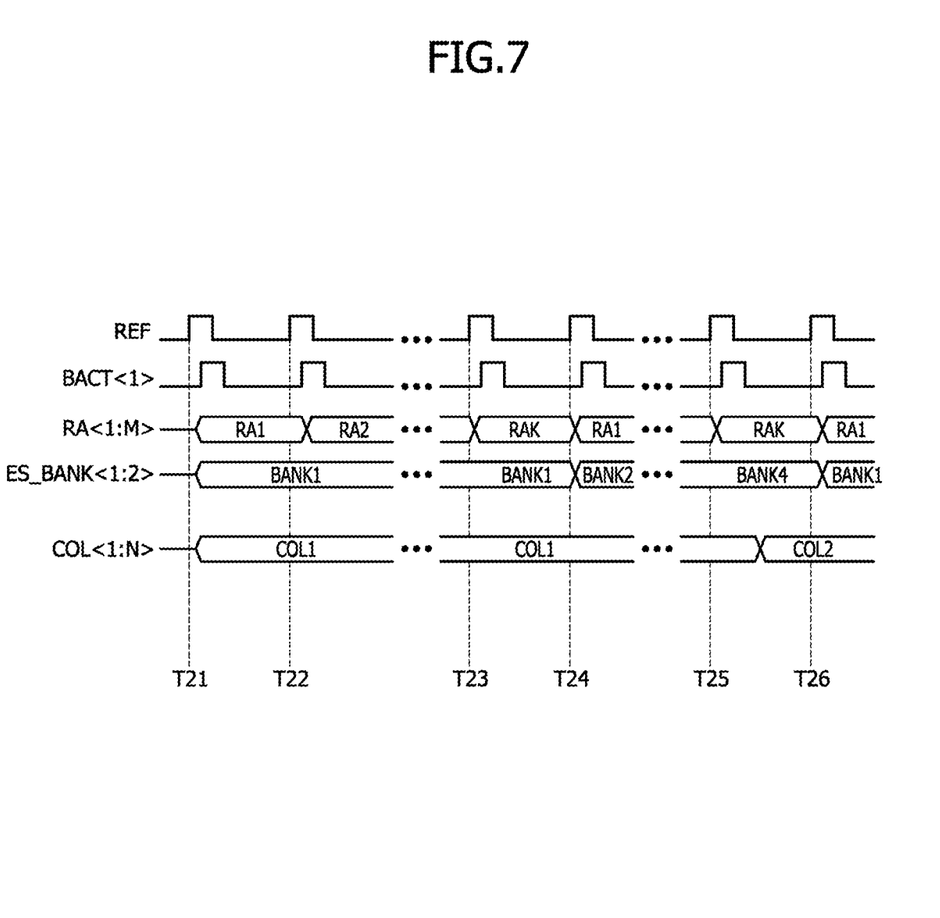

Referring to FIG. 7, the column address signal COL<1:N> may be counted to sequentially perform the error scrub operations of the first to fourth banks (BANK1, BANK2m BANK3 and BANK4 of FIG. 5).

At a point of time "T21", if a first pulse of the refresh signal REF for the first bank BANK1 is created, the row address signal RA<1:M> may be set to have a first logic level combination RA1 and the first and second error scrub bank signals ES_BANK<1:2> may be set to have a first logic level combination BANK1 in order to activate a first word line (not illustrated) of the first bank BANK1. In such a case, the column address signal COL<1:N> may be set to have a first logic level combination COL1 in order to select a first bit line of the first bank BANK1.

At a point of time "T22", if a second pulse of the refresh signal REF for the first bank BANK1 is created, the row address signal RA<1:M> may be set to have a second logic level combination RA2 in order to activate a second word line (not illustrated) of the first bank BANK1.

At a point of time "T23", if a K$^{th}$ pulse of the refresh signal REF for the first bank BANK1 is created, the row address signal RA<1:M> may be set to have a K$^{th}$ logic level combination RAK in order to activate a K$^{th}$ word line (not illustrated) of the first bank BANK1.

At a point of time "T24", if a first pulse of the refresh signal REF for the second bank BANK2 is created, the row address signal RA<1:M> may be set to have the first logic level combination RA1 and the first and second error scrub bank signals ES_BANK<1:2> may be set to have a second logic level combination BANK2 in order to activate a first word line (not illustrated) of the second bank BANK2.

During a period from a point of time "T24" till a point of time "T25", a second pulse to a K$^{th}$ pulse of the refresh signal REF for the second bank BANK2 may be created so that the row address signal RA<1:M> may be set to sequentially have the second to K$^{th}$ logic level combinations RA2~RAK. In addition, a first pulse to K$^{th}$ pulse of the refresh signal REF for the third bank BANK3 may be created so that the first and second error scrub bank signals ES_BANK<1:2> are set to have a third logic level combination BANK3 and the row address signal RA<1:M> is set to sequentially have the first to K$^{th}$ logic level combinations RA1~RAK. Moreover, a first pulse to $(K-1)^{th}$ pulse of the refresh signal REF for the fourth bank BANK4 may be created so that the first and second error scrub bank signals ES_BANK<1:2> are set to have a fourth logic level combination BANK4 and the row address signal RA<1:M> is set to sequentially have the first to $(K-1)^{th}$ logic level combinations RA1~RA(K-1).

At a point of time "T25", if a $K^{th}$ pulse of the refresh signal REF for the fourth bank BANK4 is created, the row address signal RA<1:M> may be set to have the $K^{th}$ logic level combination RAK in order to activate a $K^{th}$ word line (not illustrated) of the fourth bank BANK4. The column address signal COL<1:N> may be set to have a second logic level combination COL2 by the first and second error scrub bank signals ES_BANK<1:2> set to have the fourth logic level combination BANK4 and by the row address signal RA<1:M> set to have the $K^{th}$ logic level combination RAK.

At a point of time "T26", if a first pulse of the refresh signal REF for the first bank BANK1 is created, the row address signal RA<1:M> may be set to have the first logic level combination RA1 and the first and second error scrub bank signals ES_BANK<1:2> may be set to have the first logic level combination BANK1 in order to activate a first word line (not illustrated) of the first bank BANK1.

After the point of time "T26", while the column address signal COL<1:N> is set to sequentially have the second logic level combination COL2 to a $P^{th}$ logic level combination COLP, the row address signal RA<1:M> and the first and second error scrub bank signals ES_BANK<1:2> may be sequentially and repeatedly counted.

As described above, a semiconductor device according to an embodiment may perform an error scrub operation using an error code during a refresh operation to correct errors included in data.

Figure 8:
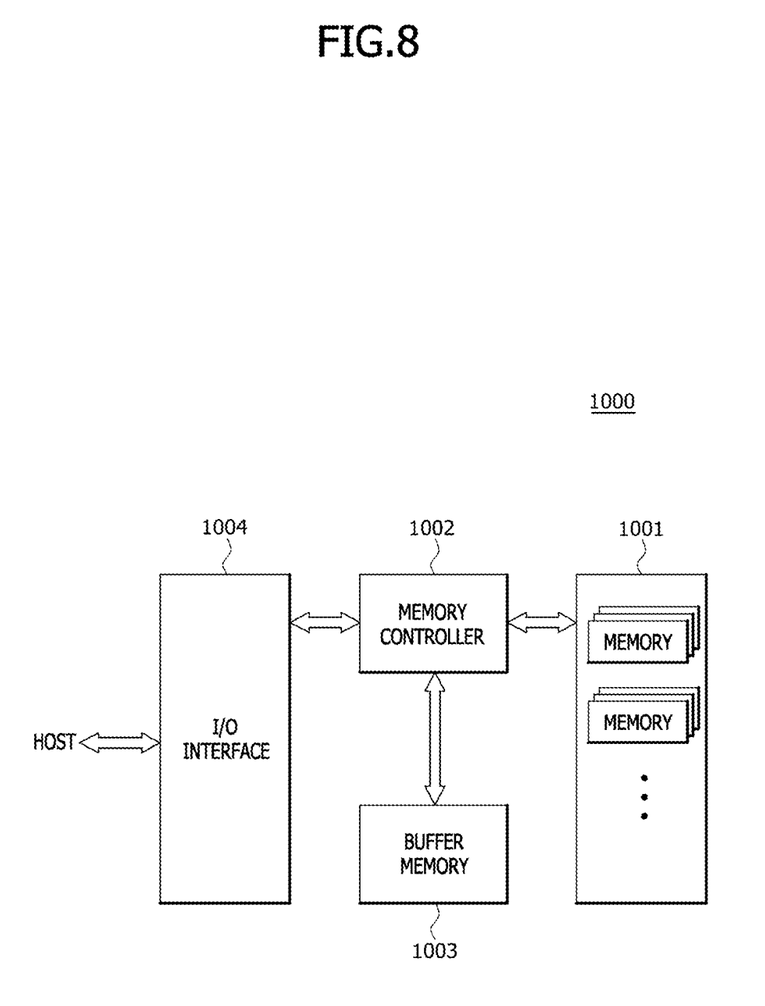
FIG. 8 is a block diagram illustrating a configuration of an electronic system employing a semiconductor device illustrated in FIGS. 1 and 7.

The semiconductor device described with reference to FIGS. 1 to 7 may be applied to an electronic system that includes a memory system, a graphic system, a computing system, a mobile system, or the like. For example, as illustrated in FIG. 8, an electronic system 1000 according an embodiment may include, for example but not limited to, a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated from the memory controller 1002. The data storage circuit 1001 may include the semiconductor devices illustrated in FIG. 1. The data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 8 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as, but not limited to, a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

Figure 9:
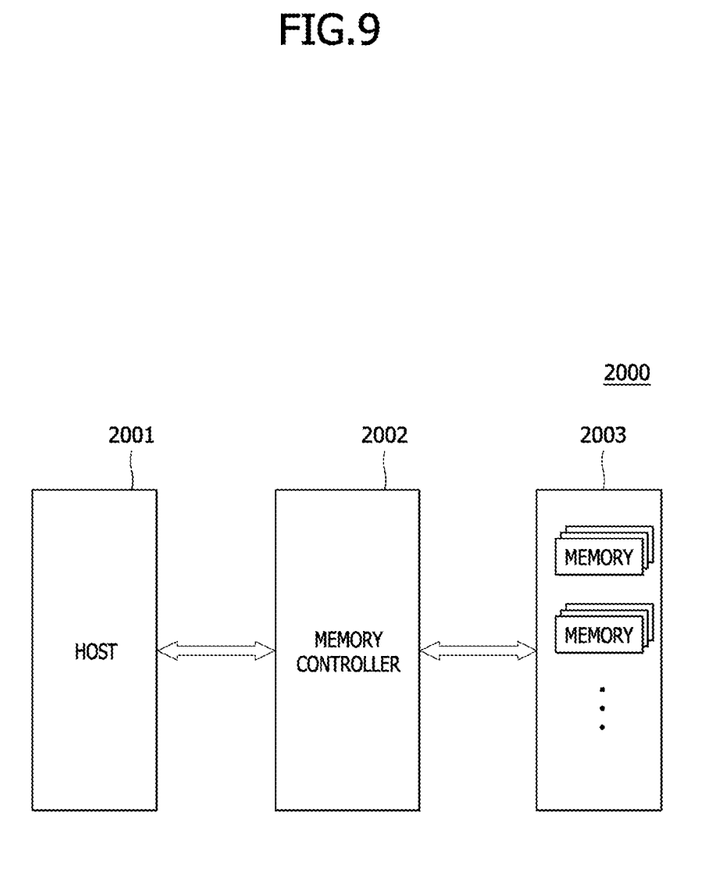
FIG. 9 is a block diagram illustrating a configuration of an electronic system employing a semiconductor device illustrated in FIGS. 1 and 7.

Referring to FIG. 9, an electronic system 2000 according to an embodiment may include a host 2001, a memory controller 2002 and a data storage circuit 2003.

The host 2001 may output a request signal and data to the memory controller 2002 to access to the data storage circuit 2003. The memory controller 2002 may supply the data, a data strobe signal, a command, an address and a clock signal to the data storage circuit 2003 in response to the request signal, and the data storage circuit 2003 may execute a write operation or a read operation in response to the command. The host 2001 may transmit the data to the memory controller 2002 to store the data into the data storage circuit 2003. In addition, the host 2001 may receive the data outputted from the data storage circuit 2003 through the memory controller 2002. The host 2001 may include a circuit that corrects errors of the data using an error correction code (ECC) scheme.

The memory controller 2002 may act as an interface that connects the host 2001 to the data storage circuit 2003 for communication between the host 2001 and the data storage circuit 2003. The memory controller 2002 may receive the request signal and the data outputted from the host 2001 and may generate and supply the data, the data strobe signal, the command, the address and the clock signal to the data storage circuit 2003 in order to control operations of the data storage circuit 2003. In addition, the memory controller

2002 may supply the data outputted from the data storage circuit 2003 to the host 2001.

The data storage circuit 2003 may include a plurality of memories. The data storage circuit 2003 may receive the data, the data strobe signal, the command, the address and the clock signal from the memory controller 2002 to execute the write operation or the read operation. Each of the memories included in the data storage circuit 2003 may include a circuit that corrects the errors of the data using an error correction code (ECC) scheme. The data storage circuit 2003 may include the semiconductor devices illustrated in FIG. 1.

In some embodiments, the electronic system 2000 may be realized to selectively operate any one of the ECC circuits included in the host 2001 and the data storage circuit 2003. Alternatively, the electronic system 2000 may be realized to simultaneously operate all of the ECC circuits included in the host 2001 and the data storage circuit 2003. The host 2001 and the memory controller 2002 may be realized in a single chip according to the embodiments. The memory controller 2002 and the data storage circuit 2003 may be realized in a single chip according to the embodiments.

What is claimed is:

1. A semiconductor device comprising:
   an error scrub control circuit configured to generate an error scrub pre-charge signal, an error scrub bank signal, an error scrub read signal, an error scrub write signal and a column address signal for performing an error scrub operation of memory cells included in banks, based on a bank active signal and a row address signal which are generated based on a refresh signal; and
   an active period signal generation circuit configured to generate an active period signal from the bank active signal and the error scrub pre-charge signal based on the error scrub bank signal.

2. The semiconductor device of claim 1, wherein the refresh signal is enabled for a refresh operation including the error scrub operation.

3. The semiconductor device of claim 1, wherein if the refresh signal is enabled, logic level combinations of bits included in the row address signal are sequentially generated while one of bits included in the bank active signal is enabled.

4. The semiconductor device of claim 1, wherein the error scrub control circuit delays the bank active signal to generate the error scrub read signal, the error scrub write signal and the error scrub pre-charge signal which are sequentially enabled.

5. The semiconductor device of claim 1, wherein the error scrub control circuit outputs the error scrub bank signal that is counted if the row address signal has a predetermined logic level combination.

6. The semiconductor device of claim 1, wherein the error scrub control circuit outputs the column address signal that is counted if the row address signal has a first predetermined logic level combination and the error scrub bank signal has a second predetermined logic level combination.

7. The semiconductor device of claim 1, wherein the error scrub control circuit includes:
   an error scrub command generation circuit configured to generate the error scrub read signal, the error scrub write signal and the error scrub pre-charge signal in response to the bank active signal; and
   an error scrub address generation circuit configured to output the error scrub bank signal that is counted in response to the row address signal and configured to output the column address signal that is counted in response to the row address signal and the counted error scrub bank signal.

8. The semiconductor device of claim 7, wherein the error scrub command generation circuit includes:
   a first delay circuit configured to delay the bank active signal to generate the error scrub read signal;
   a second delay circuit configured to delay the error scrub read signal to generate the error scrub write signal; and
   a third delay circuit configured to delay the error scrub write signal to generate the error scrub pre-charge signal.

9. The semiconductor device of claim 7, wherein the error scrub address generation circuit includes:
   a first detection circuit configured to sense the row address signal to generate a first detection signal;
   a first counter configured to generate the error scrub bank signal that is counted in response to the first detection signal;
   a second detection circuit configured to sense the error scrub bank signal to generate a second detection signal; and
   a second counter configured to generate the column address signal that is counted in response to the first and second detection signals.

10. The semiconductor device of claim 1,
    wherein the bank active signal includes a first bank active signal and a second bank active signal;
    wherein the active period signal includes a first active period signal and a second active period signal; and
    wherein the active period signal generation circuit includes:
    a first active period signal generation circuit configured to generate the first active period signal in response to the error scrub bank signal, the first bank active signal and the error scrub pre-charge signal; and
    a second active period signal generation circuit configured to generate the second active period signal in response to the error scrub bank signal, the first bank active signal, the second bank active signal and the error scrub pre-charge signal.

11. The semiconductor device of claim 10, wherein the first active period signal generation circuit generates the first active period signal which is enabled in response to the first bank active signal and is disabled in response to the error scrub pre-charge signal, if the error scrub bank signal has a first logic level combination.

12. The semiconductor device of claim 10, wherein the first active period signal generation circuit includes:
    a first selector configured to output the first bank active signal as a bank active selection signal in response to the error scrub bank signal;
    a period signal generator configured to generate the first active period signal in response to the bank active selection signal and a pre-charge selection signal;
    a period setter configured to delay the first active period signal to generate a pre-charge signal; and
    a second selector configured to output the pre-charge signal or the error scrub pre-charge signal as the pre-charge selection signal in response to the error scrub bank signal.

13. The semiconductor device of claim 10, wherein the second active period signal generation circuit generates the second active period signal which is enabled in response to the first bank active signal and is disabled in response to the error scrub pre-charge signal, if the error scrub bank signal has a second logic level combination.

14. The semiconductor device of claim 10, wherein the second active period signal generation circuit includes:
- a first selector configured to output the first bank active signal or the second bank active signal as a bank active selection signal in response to the error scrub bank signal;
- a period signal generator configured to generate the second active period signal in response to the bank active selection signal and a pre-charge selection signal;
- a period setter configured to delay the second active period signal to generate a pre-charge signal; and
- a second selector configured to output the pre-charge signal or the error scrub pre-charge signal as the pre-charge selection signal in response to the error scrub bank signal.

15. The semiconductor device of claim 1, further comprising:
- an error scrub decoder configured to generate a decoded read signal and a decoded write signal from the error scrub read signal and the error scrub write signal based on the error scrub bank signal; and
- an error scrub operation circuit configured to perform the error scrub operation based on the decoded read signal, the decoded write signal, the row address signal and the column address signal.

16. The semiconductor device of claim 15, wherein the error scrub operation circuit includes:
- an input and output (input/output) (I/O) control circuit configured to generate a read control signal and a write control signal in response to the decoded read signal, the decoded write signal, the column address signal and the row address signal;
- a data storage circuit configured to output stored data in response to the read control signal and configured to receive and store corrected data therein in response to the write control signal; and
- an error correction circuit configured to correct errors included in the stored data to generate the corrected data.

17. A semiconductor device comprising:
- an error scrub control circuit configured to generate an error scrub bank signal for performing an error scrub operation of memory cells included in banks, in response to a first bank active signal and a row address signal which are generated in response to a refresh signal;
- a first active period signal generation circuit configured to generate a first active period signal in response to the error scrub bank signal, the first bank active signal and an error scrub pre-charge signal; and
- a second active period signal generation circuit configured to generate a second active period signal in response to the error scrub bank signal, the first bank active signal, a second bank active signal and the error scrub pre-charge signal.

18. The semiconductor device of claim 17, wherein if the refresh signal is enabled for a refresh operation including the error scrub operation, logic level combinations of bits included in the row address signal are sequentially generated while the second bank active signal is enabled after the logic level combinations of the bits included in the row address signal are sequentially generated while the first bank active signal is enabled.

19. The semiconductor device of claim 17, wherein the error scrub control circuit response to the first bank active signal to generate an error scrub read signal, an error scrub write signal and an error scrub pre-charge signal which are sequentially enabled.

20. The semiconductor device of claim 17,
wherein the error scrub control circuit outputs the error scrub bank signal that is counted if the row address signal has a first predetermined logic level combination; and
wherein the error scrub control circuit outputs a column address signal that is counted if the row address signal has a second predetermined logic level combination and the error scrub bank signal has a predetermined logic level combination.

21. A semiconductor device comprising:
an error scrub control circuit configured to generate an error scrub pre-charge signal and an error scrub bank signal for performing an error scrub operation of memory cells included in banks, based on a bank active signal and a row address signal which are generated based on a refresh signal; and
an active period signal generation circuit configured to generate an active period signal from the bank active signal and the error scrub pre-charge signal based on the error scrub bank signal.

* * * * *

UNITED STATES PATENT AND TRADEMARK OFFICE
CERTIFICATE OF CORRECTION

PATENT NO. : 10,153,028 B2
APPLICATION NO. : 15/609219
DATED : December 11, 2018
INVENTOR(S) : Chang Hyun Kim Page 1 of 1

It is certified that error appears in the above-identified patent and that said Letters Patent is hereby corrected as shown below:

On the Title Page

Item (71) Applicant:
Replace "SK hynix Inc., Incheon-si, Gyeonggi-do (KR)" with --SK hynix Inc., Icheon-si, Gyeonggi-do (KR)--

Signed and Sealed this
Fifth Day of February, 2019

Andrei Iancu
*Director of the United States Patent and Trademark Office*